United States Patent [19]

Kawanaka et al.

[11] Patent Number: 5,047,365

[45] Date of Patent: Sep. 10, 1991

[54] METHOD FOR MANUFACTURING A HETEROSTRUCTURE TRANSISTOR HAVING A GERMANIUM LAYER ON GALLIUM ARSENIDE USING MOLECULAR BEAM EPITAXIAL GROWTH

[75] Inventors: Masafumi Kawanaka; Jun'ichi Sone; Tooru Kimura, all of Tokyo, Japan

[73] Assignee: NEC Corporation, Tokyo, Japan

[21] Appl. No.: 328,672

[22] Filed: Mar. 27, 1989

[30] Foreign Application Priority Data

Mar. 25, 1988 [JP] Japan .................................. 63-72336
Nov. 30, 1988 [JP] Japan ................................. 63-304387

[51] Int. Cl.$^5$ .......................................... H01L 21/20
[52] U.S. Cl. ............................ 437/132; 148/DIG. 7; 148/DIG. 41; 148/DIG. 72; 437/31; 437/95; 437/107; 437/939; 437/946
[58] Field of Search ................. 148/DIG. 3, 7, 11, 17, 148/22, 30, 35, 36, 37, 41, 58, 65, 56, 72, 97, 169, 149, 33, 33.1, 33.4; 156/610-614; 427/248.1, 255.1; 357/16, 34, 55, 56; 437/31, 81, 95, 96, 105, 106, 107, 108, 111, 126, 132, 160, 247, 936, 939, 949, 954, 971, 987

[56] References Cited

U.S. PATENT DOCUMENTS

| | | | |
|---|---|---|---|
| 4,188,710 | 2/1980 | Davey et al. ...................... | 437/132 |
| 4,261,771 | 4/1981 | Dingle et al. ...................... | 437/106 |
| 4,398,963 | 8/1983 | Stall et al. ........................... | 437/106 |
| 4,716,445 | 12/1987 | Sone ..................................... | 357/34 |

OTHER PUBLICATIONS

Grant et al., ". . . Ge-GaAs Heterojunction Interfaces," J. Vac. Sci. Techol., 15(4), Jul./Aug. 1978, pp. 1451-1455.

Murschall et al., "Low-Energy . . . with Ge:GaAs(110) Heterostructures," Solid State Comm., vol. 42, No. 11, 1982, pp. 787-791.

"Active Area Limitation of Ge/GaAs Heterojunctions by Means of B Ion Implantation", F. Ishizuka et al., J. Appl. Phys 59(2), 15 Jan. 1986, pp. 495-498.

Primary Examiner—Olik Chaudhuri
Assistant Examiner—William Bunch
Attorney, Agent, or Firm—Burns, Doane, Swecker & Mathis

[57] ABSTRACT

A heterostructure bipolar transistor is formed by a process of steps of holding an N-type gallium arsenide body using as an emitter region in a high vacuum of $10^{-9}$ torr to $10^{-13}$ torr at a first temperature of 400° C. to 1,000° C. where arsenic on a surface of the gallium arsenide body drifts away, lowering the first temperature to a second temperature of 300° C. to 400° C. to start a molecular beam epitaxial growth of a germanium, and forming an N-type germanium layer using as a collector region.

6 Claims, 6 Drawing Sheets

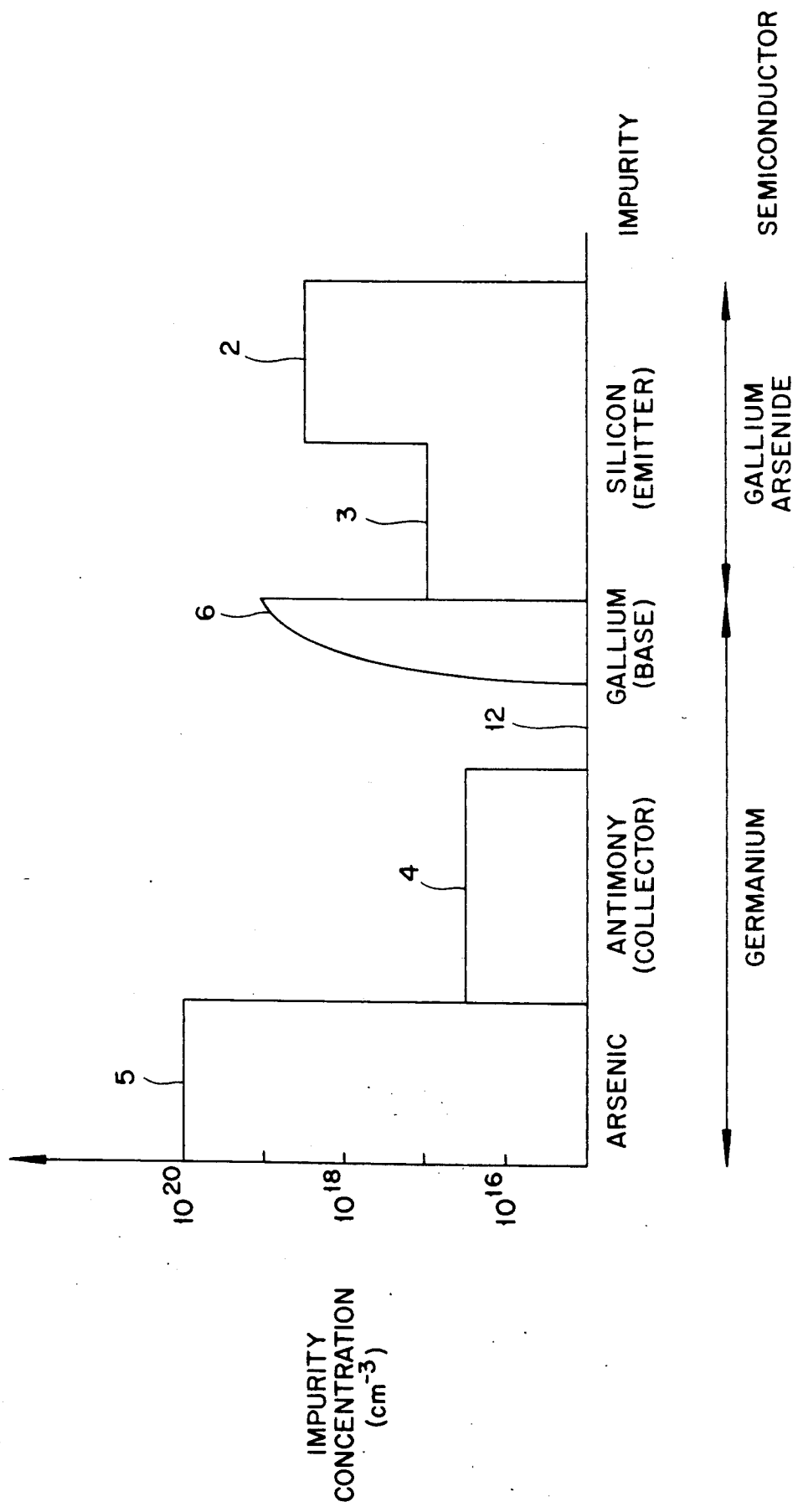

METHOD FOR MANUFACTURING A HETEROSTRUCTURE TRANSISTOR HAVING A GERMANIUM LAYER ON GALLIUM ARSENIDE USING MOLECULAR BEAM EPITAXIAL GROWTH

BACKGROUND OF THE INVENTION

1. Field of the Invention

This invention relates to a structure of a heterostructure bipolar transistor (hereinafter referred to as "HBT") in which a germanium layer is formed on a gallium arsenide body and to a method for manufacturing the same by using a molecular beam epitaxial growth.

2. Description of the Related Arts

The HBT uses an emitter region composed of a semiconductor material which has a broader energy bandgap than the semiconductor material constituting a base region. One example is described as an NPN bipolar transistor in "Journal of Applied Physics", Vol. 59, No. 2, pp. 495 to 498. Epitaxial layers of P-type germanium 21 and N-type germanium 22 are grown on an N-type gallium arsenide substrate 20 (FIG. 1(a)) and the N- and P-type germanium epitaxial layers 21 and 22 are partially mesa-etched (FIG. 1(b)). Then, a mask 70 for defining an emitter region is formed and boron ions are implanted (FIG. 1(c)). Finally, a collector electrode 23, a base electrode 24 and an emitter electrode 25 are selectively formed by a lift-off method of evaporated metal. An HBT can thus be fabricated (FIG. 1(d)).

The region of gallium arsenide substrate 20 into which boron is implanted becomes a region of gallium arsenide 26 having high resistance. Therefore, it becomes possible to inject electrons into P-type germanium layer 21 and to extract them from the N-type germanium layer 22, so as to make the transistor operate as an NPN bipolar transistor using gallium arsenide substrate 20 as the emitter, germanium layer 21 as the base and germanium layer 22 as the collector. Here, the N-type germanium layer 22 and the P-type germanium layer 21 can be formed by molecular beam epitaxial growth method.

However, arsenic in the gallium arsenide substrate 20 diffuses into the P-type germanium layer 21 in the heterojunction of gallium arsenide and germanium. Thus, the P-type germanium layer 21 is doped to an N-type with an impurity concentration of as high as at least $10^{18}$ cm$^{-3}$. In order to dope the germanium epitaxial film 21 directly grown on the gallium arsenide substrate 20 to the P-type, it is, therefore, necessary to highly dope an acceptor above $10^{18}$ cm$^{-3}$ so as to compensate the impurity doped from the substrate 20. Accordingly, it is difficult to grow a germanium layer directly on a gallium arsenide substrate to have a P-type of such a high impurity concentration. A base layer in a bipolar transistor is very thin. Therefore, the formation of such a base layer with high controllability is very difficult technically. Moreover, since electron and positive hole mobilities decrease in the semiconductor epitaxial film whose impurity is thus compensated, base resistance of the base layer as well as the electron travelling time in the base layer increase and, thus, they exert adverse influences on the electrical characteristics of the transistor.

This problem occurs not only in HBT, in particular, but also in other applications using the germanium epitaxial film directly grown on gallium arsenide body such as in a P-channel field effect transistor using the germanium epitaxial film on gallium arsenide substrate.

As above-mentioned, HBT utilizing the heterojunction between gallium arsenide body and germanium layer epitaxially grown on the gallium arsenide body involves the problem that arsenic in the gallium arsenide body diffuses into the grown germanium layer at the interface therebetween so that the germanium layer is doped with the N-type impurities. To accomplish NPN type HBT, the germainum layer which is directly grown on gallium arsenide body as a base layer must be a P-type epitaxial film having an extremely small film thickness. Under such condition where diffusion of arsenic occurs as described above, a P-type dopant having a higher concentration must be added to the extremely thin germanium layer. This is not only difficult technically but also invites the drop of mobility of the positive hole or electron in such a base layer whose impurity is compensated for, so that the electrical characteristics of the transistor become deteriorated.

The problems described above occur not only in HBT but also in other applications using the germanium epitaxial film on gallium arsenide in general.

SUMMARY OF THE INVENTION

It is an object of the present invention to provide a novel heterojunction bipolar transistor exhibiting excellent electrical characteristics and to provide a method for manufacturing the heterojunction bipolar transistors, particularly, a transistor having a heterojunction of a gallium arsenide body and a germanium layer directly grown on the body by using a novel molecular beam epitaxial growth.

The present invention provides an NPN heterostructure bipolar transistor formed of an emitter region of an N-type gallium arsenide body, a base region of a germanium layer formed on the emitter region body and diffused with gallium from the gallium arsenide body and a collector region formed in contact with the base region.

The present invention also provides a molecular beam epitaxial growth method in which after a temperature of a gallium arsenide body is kept at a first temperature where arsenic on the surface of the gallium arsenide body is eliminated in ultra-high vacuum, then the temperature is lowered to a second temperature and epitaxial growth of germanium is carried out. The first temperature is preferably selected in a range from 400° C. to 1,000° C. and the ultra-high vacuum is in a range from $10^{-9}$ torr to $10^{-13}$ torr.

The NPN heterostructure bipolar transistor according to the present invention is provided by holding a gallium arsenide body at a first temperature from 400° C. to 1,000° C. in a vacuum from $10^{-9}$ torr to $10^{-13}$ torr, thereafter the temperature is lowered to a second temperature to start an epitaxial growth of germanium on the gallium arsenide body, and then depositting a semiconductor collector layer on the germanium epitaxial layer.

After an epitaxial film of gallium arsenide is grown on a gallium arsenide body by a molecular beam epitaxial growth method while the body temperature is kept at 400° C. to 1,000° C., preferably at 500° C. to 700° C., gallium arsenide contains arsenic adsorbed onto its surface besides gallium as the constituent element of gallium arsenide bonded by the original covalent bond. According to the experiments conducted by the inventors of the present invention, if germanium is grown under this state at a body temperature of 300° to 400° C., the adsorbed arsenic is doped into the grown germanium layer to form an N-type germanium film. On the other hand, if prior to the growth of germanium the body temperature is raised to a temperature at which arsenic is eliminated, such as 600° C., and is kept under ultra-high vacuum, then the arsenic adsorbed on the surface evaporates first and the arsenic thereunder in covalent bond with gallium appears on the surface. If the substrate is further kept at the high temperature, the arsenic of the covalent bond on the surface evaporates and gallium appears on the surface. These changes of state can be observed by high energy electron beam diffraction. According to the experiments of the present inventors, it has been found that after arsenic adsorbed onto the surface evaporates, if a germanium layer is grown consecutively by molecular beam epitaxy at the body temperature of 300° to 400° C. whether arsenic or gallium of the covalent bond may appear on the surface, the grown germanium layer becomes a P-type having a concentration of $10^{17}$ cm$_{-3}$ to $10^{18}$ cm$^{-3}$. This is because gallium in gallium arsenide diffuses into the grown germanium layer. This P-type germanium layer does not involve the compensation of any impurity, and mobility of electrons and positive holes is kept high.

Based on the fact described above, if high purity germanium or germanium having a donor concentration of of about $10^{17}$ cm$^{-3}$ or below is grown under the condition where diffusion of gallium into the grown germanium layer takes place and the grown germanium layer to which no impurity is added becomes the P-type, a part of the grown germanium layer near its interface with the gallium arsenide body is doped to the P-type by the diffusion of gallium to form automatically a ultra-thin base layer.

The molecular beam epitaxial growth method described above can be applied not only to HBT but also to other applications requiring the P-type germanium epitaxial film, for which no impurity is compensated, on gallium arsenide.

BRIEF DESCRIPTION OF THE DRAWINGS

The above and further objects, features and advantages of the present invention will become more apparent from the following detailed description taken in conjunction with the accompanying drawings, wherein:

FIG. 6 is a diagram showing a distribution of impurity concentrations in the HBT according to the second embodiment of the present invention.

DESCRIPTION OF THE PREFERRED EMBODIMENTS

Hereinafter, embodiments of the present invention will be described with reference to the drawings.

Figure 1A:
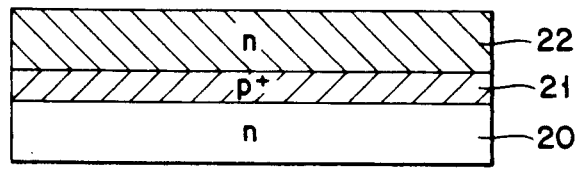
FIGS. 1(a) to 1(d) are sectional views useful for explaining a conventional manufacturing method of HBT transistor.
Figure 1D:
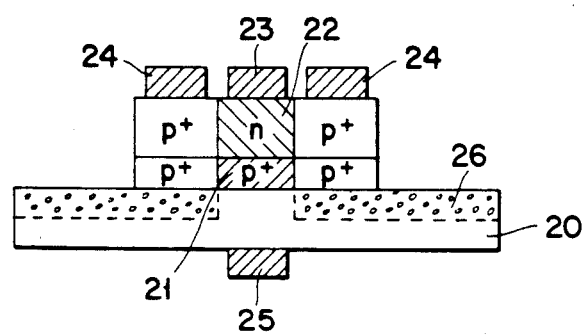
Figure 1B:
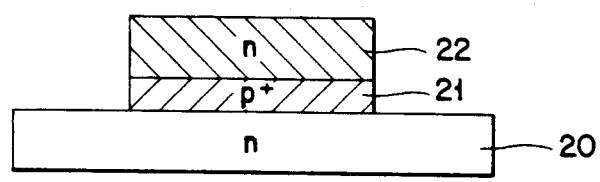
Figure 2:
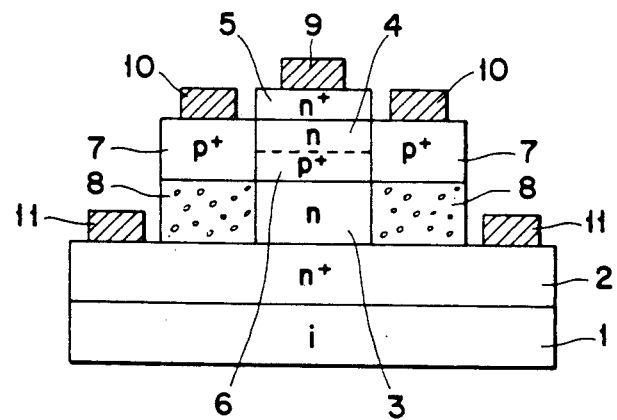
FIG. 2 is a schematic sectional view of a first embodiment of HBT of the present invention.
Figure 1C:
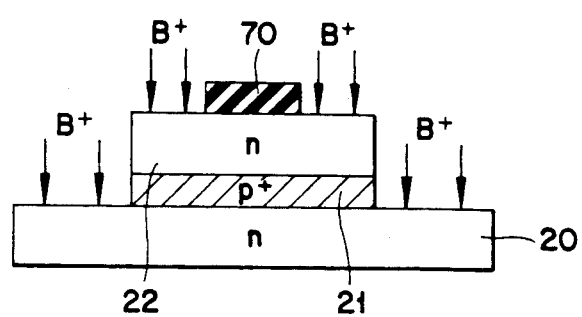

FIG. 2 is a schematic sectional view showing a first embodiment of the present invention. Formed on a semi-insulating gallium arsenide substrate 1 are an N-type epitaxial gallium arsenide film 2 doped with silicon at a high concentration of $5 \times 10^{18}$ cm$^{-3}$, an N-type gallium arsenide epitaxial film 3 doped with silicon at a concentration of $1 \times 10^{17}$ cm$^{-3}$, an N-type germanium epitaxial film 4 doped with antimony at a concentration of $5 \times 10^{16}$ cm$^{-3}$, and a high concentration N-type germanium epitaxial film 5 doped with arsenic at a concentration of $1 \times 10^{20}$ cm$^{-3}$. During the growth of the N-type germanium film 4 on the N-type gallium arsenide film 4, gallium diffuses from the gallium arsenide film 3 into the germanium film 4 at the interface therebetween to change the N-type germanium film 4 into a high concentration P-type germanium layer 6 having an impurity concentration of from about $10^{18}$ to about $10^{19}$ cm$^{-3}$. Regions of the high concentration P-type germanium 7 is formed by the ion implantation of boron and regions of high resistance gallium arsenide 8 formed by the ion implantation of boron below the germanium region 7 are located on both sides of the N-type germanium film 4. Furthermore, a collector electrode 9, a base electrode 10 and an emitter electrode 11 are disposed on the high concentration N-type germanium film 5, the high concentration P-type germanium regions 7 and the high concentration N-type gallium arsenide film 2, respectively. The N-type gallium arsenide film 3, the high concentration P-type germanium region 6 and the N-type germanium film 4 function as the emitter layer, the base layer and the collector layer, respectively.

Figure 3:
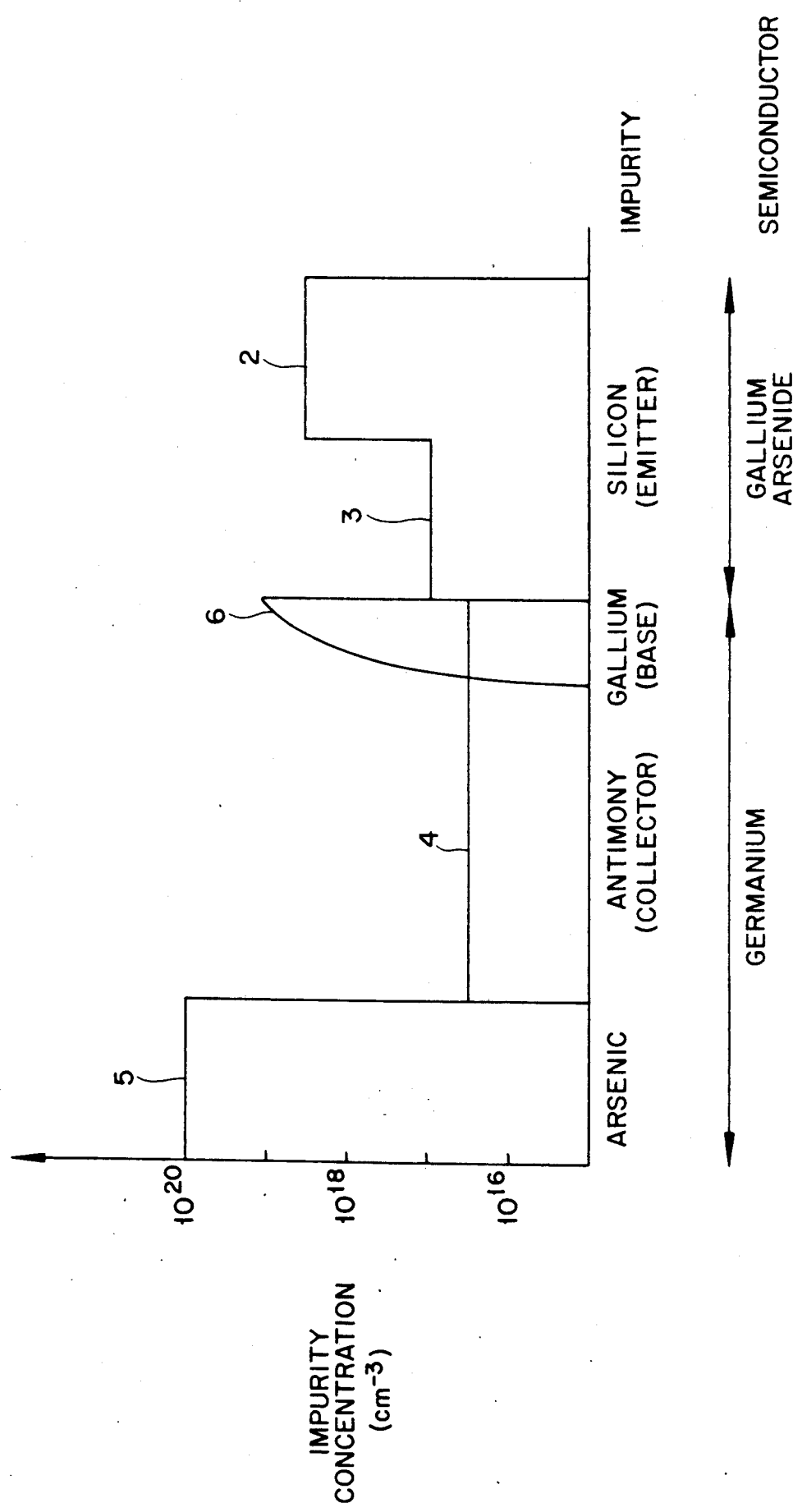
FIG. 3 is a diagram showing a distribution of impurity concentrations in the HBT according to the first embodiment of the present invention.

FIG. 3 shows a diagram of impurity distribution of impurity concentration having the ordinate showing the impurity concentration by logarithm. As shown in the diagram, since gallium diffuses from the gallium arsenide film 3 into the germanium region 6, the gallium concentration drops progressively with an increasing distance from the interface between the gallium arsenide film 3 and the germanium region 6. This means that an internal field occurs in the base, that is, in the germanium region 6, due to the spatial change of the impurity distribution so that the electrons injected from the emitter into the base may be accelerated by this internal field. This contributes to the high speed operation of the heterostructure. Since the diffusion phenomenon occuring at the interface between the gallium arsenide film 3 and the germanium film 4 is utilized for the formation of the base layer of the P-type germanium region 6, a high concentration and ultra-thin base layer having an impurity concentration of $10^{18}$ to $10^{19}$ cm$^{-3}$ and a film thickness of up to 100 nm can be formed automatically.

Figure 4A:
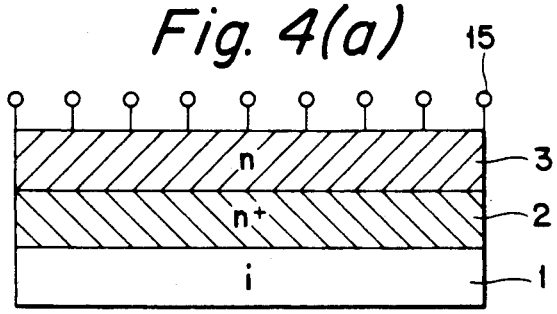
FIGS. 4(a) to 4(f) are sectional views showing a manufacturing method of the HBT according to the first embodiment of the present invention.

FIGS. 4(a) to 4(f) are sectional views useful for explaining the formation of the HBT shown in FIGS. 2 and 3. First, as shown in FIG. 4(a), a high concentration N-type gallium arsenide film 2 doped with silicon as the impurity and an N-type gallium arsenide film 3 are consecutively grown on a semi-insulating gallium arsenide substrate 1 having a (100) orientation by molecular beam epitaxy at a substrate temperature of 650° C. Subsequently, the substrate 1 is cooled down to room temperature while an arsenic beam is radiated lest elimination of arsenic occurs. Under this state, the arsenic atoms 15 that are adsorbed exist on the surface. The existence of the adsorbed arsenic atoms 15 can be observed by a reflection type high energy electron beam diffraction apparatus incorporated in a molecular beam epitaxy apparatus and the surface exhibits a (2×2) super-structure. Thereafter, the substrate 1 is transferred under ultra-high vacuum from the growth chamber where gallium arsenide is grown to a different growth chamber and the arsenic pressure as the background can thus be kept below $10^{-9}$ Torr. Subsequently, the substrate temperature is raised to 500° C. under this state and arsenic adsorbed on the surface is evaporated away (FIG. 4(b)). The state change of this surface can be observed by the reflection type high energy electron diffraction apparatus described above and the surface changes from the (2×2) super-structure to the (2×4) super-structure.

Figure 4D:
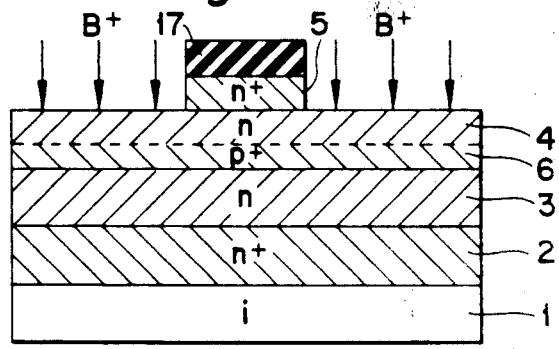
Figure 4B:
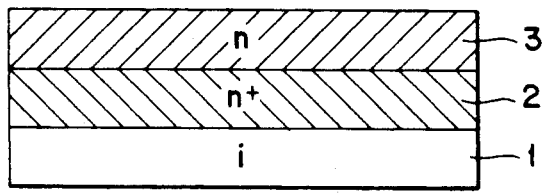
Figure 4E:
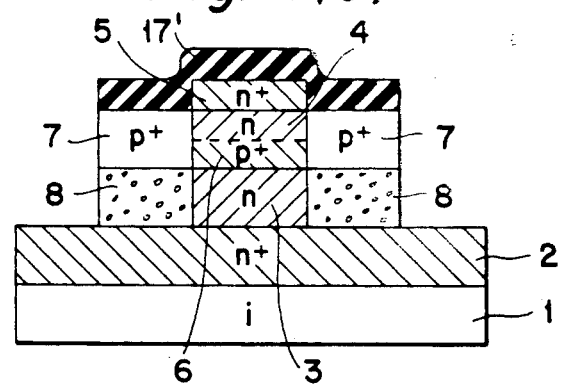
Figure 4C:
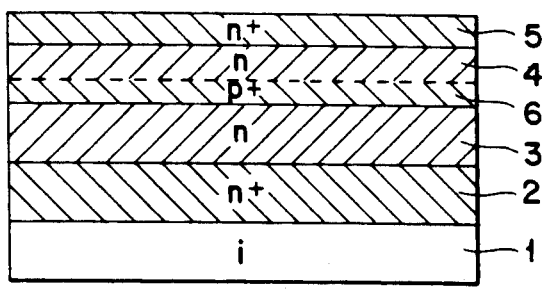
Figure 4F:
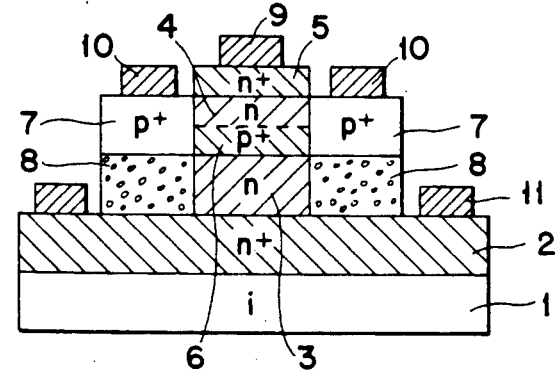

The substrate temperature is then lowered to 350° C. and epitaxial films of N-type germanium 4 and high concentration N-type germanium 5 are grown using antimony as the impurity by molecular beam epitaxy (FIG. 4(c)). At this time, gallium diffuses from gallium arsenide film 3 into the germanium film 4 at the interface between the gallium arsenide film 3 and the germanium film 4 to form a high concentration P-type germanium region 6 in the germanium film 4.

To fabricate a bipolar transistor by use of the heterojunction epitaxial films of gallium arsenide and germanium described above, a resist 17 is deposited subsequently onto a region where an emitter layer is to be formed, by lithography, part of the high concentration N-type germanium layer 5 is etched and thereafter boron ion (B+) is implanted (FIG. 4(d)).

Subsequently, the resist 17' is put onto a region where a base layer is to be formed, followed by etching the germanium film 4, the germanium region 6 and the gallium arsenide film 3 until the surface of high concentration N-type gallium arsenide film 2 is exposed (FIG. 4(e)). Thereafter, an emitter electrode 11, a base electrode 10 and a collector 9 are formed by lift-off method of gold-germanium-nickel, gold-indium and gold-antimony (FIG. 4(f)). There is, thus, fabricated a heterostructure bipolar transistor using gallium arsenide as the emitter and germanium as the base.

Figure 5:
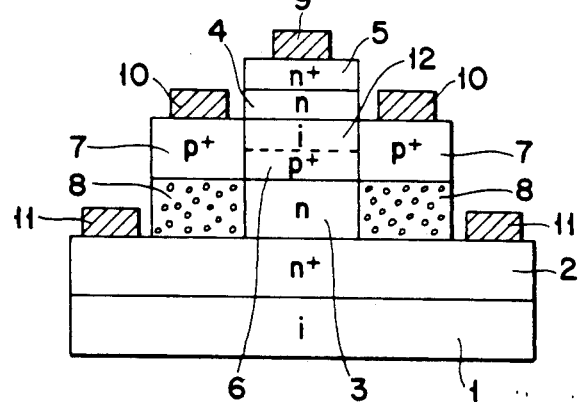
FIG. 5 is a schematic sectional view of a second embodiment of HBT of the present invention.

FIG. 5 is a schematic sectional view of HBT according to a second embodiment of the present invention. A high purity germanium epitaxial film 12 containing no impurity is formed on an N-type gallium arsenide epitaxial film 3. An N-type germanium epitaxial film 4 doped with antimony at an impurity concentration of $5 \times 10^{16}$ cm$^{-3}$ is formed further on the germanium epitaxial film 12. The rest of the structure is the same as in the first embodiment shown in FIGS. 2 to 4. During the deposition of the germanium film 12, gallium diffuses from the gallium arsenide film 3 into the germanium film 12 at their interface so as to make a high concentration P-type germanium region 6 having an impurity concentration of about $10^{18}$ to about $10^{19}$ cm$^{-3}$ in the germanium film 12.

FIG. 6 shows a diagram of impurity distribution of the HBT shown in FIG. 5 having the ordinate representing the impurity concentration by logarithm. In the same way as in the first embodiment shown in FIG. 2, the internal field occurs in the base, that is, the P-type germanium region 6, due to the distribution of gallium diffused from the gallium arsenide layer 3 into the germanium layer 12, so that the transistor may operate at a high speed. It is possible to form automatically a high concentration and ultra-thin P-type base layer having an impurity concentration of $10^{18}$ to $10^{19}$ cm$^{-3}$ and a film thickness of up to 100 nm by utilizing this diffusion phenomenon. In this second embodiment, carrier mobility is high because no impurity is added to the base layer (6).

Though the high purity germanium layer 12 is disposed on the gallium arsenide layer 3 in this second embodiment, the P-type germanium region 6 may be disposed by depositing the germanium layer 12 on the gallium arsenide layer 3, similar to the first embodiment.

Figure 7A:
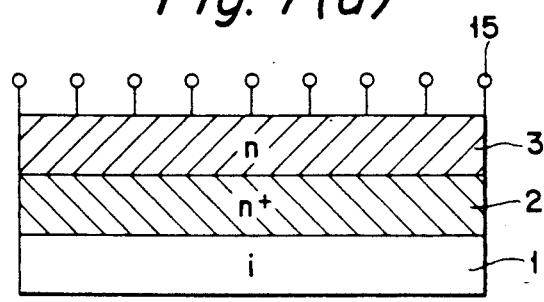
FIGS. 7(a) to 7(f) are sectional views showing a manufacturing method of the HBT according to the second embodiment of the present invention.
Figure 7B:
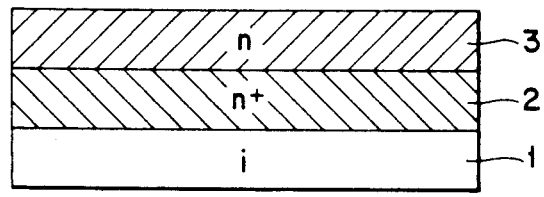

FIGS. 7(a) to 7(f) are sectional views useful for explaining the formation of the HBT shown in FIG. 5 by using molecular beam epitaxy of germanium. A high concentration N-type gallium arsenide layer 2 using silicon as impurity and an N-type gallium arsenide layer 3 are grown, as shown in FIG. 7(a), on a semi-insulating gallium arsenide substrate 1 having a (100) orientation at a substrate temperature of 650° C. by molecular beam epitaxy. Subsequently, the substrate is cooled down to a room temperature while the arsenic beam is radiated lest elimination of arsenic 15 occurs.

Under this state, the adsorbed arsenic atoms 15 exist on the surface of the N-type gallium arsenide layer 3. This can be observed by the reflection type high energy electron diffraction incorporated in the molecular beam epitaxy apparatus, and the surface exhibits the superstructure of (2×2). Thereafter, the substrate is transferred from the chamber where gallium arsenide is grown to a different chamber under a ultra-high vacuum and the arsenic pressure of the background can be kept below $10^{-9}$ Torr. Under this state the substrate temperature is raised to 500° C. at which germanium is grown (FIG. 7(b)). At this time, arsenic that has adsorbed to the gallium arsenide layer 3 evaporates away. The state change of the surface can be observed by the reflection type high energy electron diffraction apparatus described above and the surface changes from the (2×2) super-structure to the (2×4) super-structure. Subsequently, a high purity germanium layer 12, the N-type germanium layer 4 using antimony as the dopant and the high concentration N-type germanium layer 5 using arsenic as the dopant are continuously grown by molecular beam epitaxy at a substrate temperature of 500° C. (FIG. 7(c)). At this time, gallium diffuses from the gallium arsenide layer 3 to the high purity germanium layer 12 so that a portion of the germanium layer 12 near the interface with the gallium arsenide layer 3 changes to the high concentration P-type region 6.

Figure 7C:
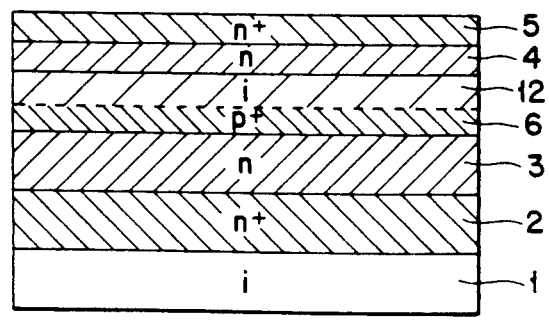
Figure 7D:
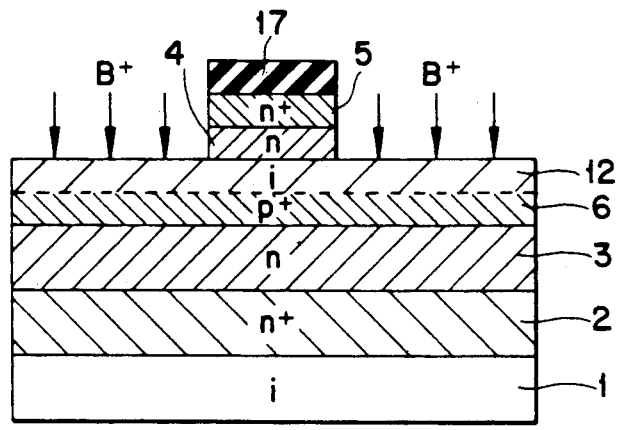

To fabricate a bipolar transistor by use of the heterojunction of gallium arsenide and germanium described above, a resist 17 is deposited to a region where an emitter layer is to be formed, by lithography, each part of the high concentration N-type germanium layer 5 and the N-type germanium layer 4 is etched followed by implanting boron ions (B+) (FIG. 7(d)).

Figure 7E:
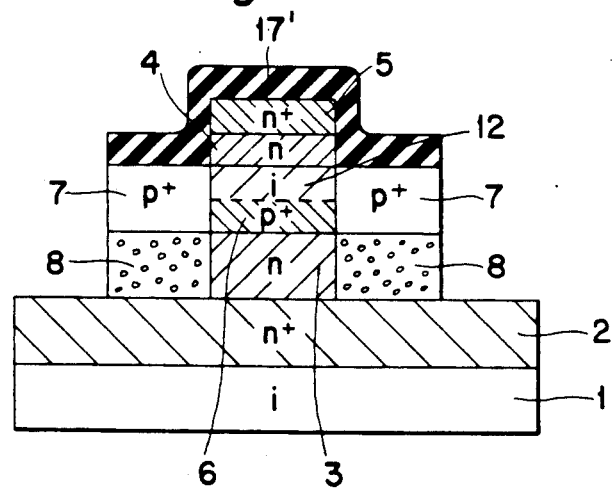
Figure 7F:
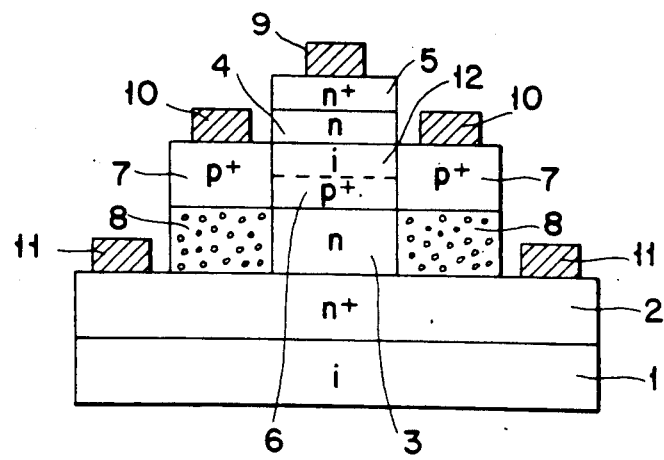

Next, the resist 17' is formed to the region where a base layer is to be formed and the germanium layer 12, the P-type germanium region 6 and the gallium arsenide layer 3 are consecutively etched until a surface of the high concentration N-type gallium arsenide 2 is exposed (FIG. 7(e)). Thereafter, an emitter electrode 11, a base electrode 10 and a collector electrode 9 are formed by a lift-off method of gold-germanium-nickel, gold-indium and gold-antimony, respectively (FIG. 7(f)). There is, thus, obtained a heterostructure bipolar transistor using gallium arsenide for the emitter and germanium for the base.

According to the present invention, a P-type germanium layer can be formed on a gallium arsenide body by using diffusion of gallium from the gallium arsenide body into the germanium layer while the arsenic is prevented from being diffused. The diffusion of the arsenic has been a problem in the germanium deposition on the gallium arsenide body by molecular beam epitaxy. This problem can be overcome by the present invention. Particularly according to the present invention, the temperature is raised to evaporate the arsenic atoms adsorbing on the surface of the gallium arsenide body, after the growth of the gallium arsenide body and the substrate temperature is lowered to start the growth of germanium layer. Therefore, low temperature growth becomes possible. It is, thus, possible to shorten the diffusion distance of gallium in the germanium layer to accomplish a ultra-thin P-type germanium layer.

According to another aspect of the invention, since the temperature is temporarily set to a substrate temperature at which germanium grows after the growth of gallium arsenide, there can be obtained the advantage that the fabrication is easy. During this elevation process of the substrate temperature, the arsenic atoms adsorbed onto the surface of gallium arsenide are evaporated away and there can be established the state where gallium diffuses preferentially into the growing germanium.

In HBT of gallium arsenide and germanium, the present invention forms automatically the base layer by the diffusion of gallium into the germanium from the gallium arsenide body that occurs at the interface between the gallium arsenide body and the depositing germanium layer. Accordingly, it is possible not only to accomplish a ultra-thin high concentration P-type base layer necessary for the ultra-high speed operation of HBT but also to accomplish a drift base structure because the gallium concentration in the germanium layer becomes progressively smaller from the emitter side to the collector side. Accordingly, the ultra-high speed operation of HBT becomes possible.

Though the embodiment relating to molecular beam epitaxy deals with the application to HBT, the present invention is not limited thereto but can be applied to other applications using the P-type germanium epitaxial film on a gallium arsenide body such as a P-channel field effect transistor formed by use of the P-type germanium epitaxial film.

What is claimed is:

1. A method for manufacturing a heterostructure bipolar transistor comprising the steps of (1) forming on a substrate an N-type gallium arsenide layer serving as an emitter region by molecular beam epitaxial growth; (2) holding said gallium arsenide layer in a high vacuum at a first temperature causing arsenic atoms on a surface of said gallium arsenide layer to evaporate from said surface, and (3) forming a germanium layer serving as a collector region on said gallium arsenide layer at a second temperature lower than said first temperature to form simultaneously a P-type germanium region serving as a base region at the interface of said gallium arsenide layer and said germanium layer by diffusing of gallium atoms from said gallium arsenide layer.

2. A method for manufacturing a heterostructure bipolar transistor as claimed in claim 1, wherein said geranium layer is grown directly on said N-type gallium arsenide layer by molecular beam epitaxial growth.

3. A method for manufacturing a heterostructure bipolar transistor as claimed in claim 2, wherein said first temperature is 400° C. to 1000° C., said high vacuum being from $10^{-9}$ torr to $10^{-13}$ torr and said second temperature being 300° C. to 400° C.

4. A method for forming a P-type germanium region on a gallium arsenide layer comprising the steps of (1) forming on a substrate a gallium arsenide layer by molecular beam epitaxial growth; (2) holding said gallium arsenide layer in a high vacuum at a first temperature where arsenic atoms on a surface of said gallium arsenide layer evaporate; and (3) lowering said first temperature to a second temperature and growing a germanium layer on said gallium arsenide layer at said second temperature, said P-type germanium region being simultaneously formed at the interface of said gallium arsenide layer and said germanium layer by the diffusion of gallium from said gallium arsenide layer.

5. A method for forming a P-type germanium region on a gallium arsenide layer as claimed in claim 4, wherein said first temperature is from 400° C. to 1,000° C., said high vacuum being from $10^{-9}$ Torr to $10^{-13}$ Torr and said second temperature being 300° C. to 400° C.

6. A method for forming a P-type germanium region on a gallium arsenide body as claimed in claim 4, wherein said germanium region is deposited by molecular beam epitaxial growth.

* * * * *